(12) United States Patent
Maruko et al.

(10) Patent No.: US 8,970,312 B2
(45) Date of Patent: Mar. 3, 2015

(54) DIFFERENTIAL RING OSCILLATION CIRCUIT, DEVICE, AND OSCILLATION CONTROL METHOD

(71) Applicant: Sony Corporation, Tokyo (JP)

(72) Inventors: Kenichi Maruko, Kanagawa (JP); Masayuki Katakura, Kanagawa (JP)

(73) Assignee: Sony Corporation, Tokyo (JP)

( * ) Notice: Subject to any disclaimer, the term of this patent is extended or adjusted under 35 U.S.C. 154(b) by 31 days.

(21) Appl. No.: 13/959,015

(22) Filed: Aug. 5, 2013

(65) Prior Publication Data

US 2014/0055204 A1     Feb. 27, 2014

(30) Foreign Application Priority Data

Aug. 27, 2012  (JP) ................. 2012-186725

(51) Int. Cl.
*H03K 3/03* (2006.01)
*H03L 7/00* (2006.01)
*H03L 3/00* (2006.01)

(52) U.S. Cl.
CPC .. *H03L 7/00* (2013.01); *H03L 3/00* (2013.01); *H03K 3/0322* (2013.01)
USPC ............................................................ 331/57

(58) Field of Classification Search
CPC ... H03K 3/0322; H03K 3/0315; H03K 3/014; H03L 3/00; H03L 7/00
USPC ............................................................ 331/57
See application file for complete search history.

(56) References Cited

U.S. PATENT DOCUMENTS 7,071,750 B2 * 7/2006 Lin ............................... 327/251
7,719,370 B2 * 5/2010 Takai ............................ 331/57

FOREIGN PATENT DOCUMENTS

JP       2009-200662       9/2009

* cited by examiner

*Primary Examiner* — Ryan Johnson
(74) *Attorney, Agent, or Firm* — Rader, Fishman & Grauer PLLC (57) ABSTRACT

There is provided a differential ring oscillation circuit including a differential ring oscillation unit in which delay circuits, to which signals of 2 phases are input, and which delay and output the input signals of 2 phases, are connected at even stages in a ring form, first and second common-mode level detection units that detect that the input signals of 2 phases of one delay circuit at an even stage of the differential ring oscillation unit and the input signals of 2 phases of one delay circuit at an odd stage of the differential ring oscillation unit are at same predetermined levels, respectively, and first and second switches that set, to specific potentials, one of the output signals of 2 phases of the delay circuit delaying the input signals of 2 phases, when the first and second common-mode level detection units detect the same predetermined levels, respectively.

8 Claims, 4 Drawing Sheets

DIFFERENTIAL RING OSCILLATION CIRCUIT, DEVICE, AND OSCILLATION CONTROL METHOD

BACKGROUND

The present disclosure relates to a differential ring oscillation circuit, a device including the differential ring oscillation circuit, and an oscillation control method of controlling the differential ring oscillation circuit.

A differential ring oscillation circuit including delay circuits at even stages has been used as a clock generation circuit in various devices. For example, a differential ring oscillation circuit including delay circuits at even stages has been used as a clock generation circuit that supplies a clock to a plurality of flip-flops which are included in a wired communication device and are connected in parallel. In the flip-flops which are included in the wired communication device and are connected in parallel, a multi-phase clock shifted by ½ period or ¼ period from a reference phase is necessary. In an orthogonal modulator or an orthogonal demodulator included in a wireless communication device, a multi-phase clock shifted by ¼ period from a reference phase is also necessary. When the multi-phase clock shifted by ½ period or ¼ period is necessary, a differential ring oscillation circuit including delay circuits at even stages is used.

Meanwhile, such an oscillation circuit may enter a state called deadlock due to an oscillation state fault, and thus a clock may not be generated in some cases.

Japanese Unexamined Patent Application Publication No. 2009-200662 discloses a technology for operating a deadlock detection circuit and recovering a normal oscillation state in a phase locked loop (PLL) circuit using an oscillation circuit, when a frequency of a feedback signal exceeds a threshold value.

SUMMARY

In the oscillation circuit, it is necessary to avoid the occurrence of the above-described deadlock. However, in practice, deadlock may easily occur due to an oscillation state fault, as an integrated circuit in which an oscillation circuit is embedded is miniaturized and a power voltage is lowered.

In the related art, as disclosed in Japanese Unexamined Patent Application Publication No. 2009-200662, the deadlock detection circuit is provided to take countermeasures when it is detected that deadlock occurs. However, an oscillation circuit which can stably be activated by avoiding the occurrence of deadlock is preferable.

It is desirable to provide a differential ring oscillation circuit, a device, and an oscillation control method capable of avoiding occurrence of deadlock.

According to an embodiment of the present disclosure, there is provided a differential ring oscillation circuit including a differential ring oscillation unit in which delay circuits delaying and outputting input signals of 2 phases are connected at even stages in a ring form. The differential ring oscillation circuit further includes first and second common-mode level detection units that are connected to the delay circuits of the differential ring oscillation unit; and first and second switches that are controlled by the common-mode level detection units, respectively.

The first common-mode level detection unit detects that the input signals of 2 phases of one delay circuit at an even stage of the differential ring oscillation unit are at the same predetermined level.

The second common-mode level detection unit detects that the input signals of 2 phases of one delay circuit at an odd stage of the differential ring oscillation unit are at the same predetermined level.

When the first common-mode level detection unit detects the same predetermined level, the first switch sets, to a specific potential, one of the output signals of 2 phases of the delay circuit delaying the input signals of 2 phases.

When the second common-mode level detection unit detects the same predetermined level, the second switch sets, to the specific potential, one of the output signals of 2 phases of the delay circuit delaying the input signals of 2 phases.

According to another embodiment of the present disclosure, there is provided a device including a differential ring oscillation unit in which delay circuits delaying and outputting input signals of 2 phases are connected at even stages in a ring form; and a processing unit that is supplied with the signals extracted from the differential ring oscillation unit as a clock.

The device further includes first and second common-mode level detection units that are connected to the delay circuits of the differential ring oscillation unit; and first and second switches that are controlled by the common-mode level detection units, respectively.

The first common-mode level detection unit detects that the input signals of 2 phases of one delay circuit at an even stage of the differential ring oscillation unit are at the same predetermined level.

The second common-mode level detection unit detects that the input signals of 2 phases of one delay circuit at an odd stage of the differential ring oscillation unit are at the same predetermined level.

When the first common-mode level detection unit detects the same predetermined level, the first switch sets, to a specific potential, one of the output signals of 2 phases of the delay circuit delaying the input signals of 2 phases.

When the second common-mode level detection unit detects the same predetermined level, the second switch sets, to the specific potential, one of the output signals of 2 phases of the delay circuit delaying the input signals of 2 phases.

According to still another embodiment of the present disclosure, there is provided an oscillation control method including extracting input signals of 2 phases of one delay circuit at an even stage from a differential ring oscillation unit in which delay circuits delaying and outputting the signals of 2 phases are connected at even stages in a ring form; and extracting input signals of 2 phases of one delay circuit at an odd stage of the differential ring oscillation unit.

When it is detected that the input signals of 2 phases are at the same predetermined level, a process of setting one of the output signals of 2 phases of the delay circuit delaying the input signals of 2 phases to a specific potential is performed.

When it is detected that the input signals of 2 phases are at the same predetermined level, a process of setting one of the output signals of 2 phases of the delay circuit delaying the input signals of 2 phases to the specific potential is performed.

According to the embodiments of the present disclosure, one of the output signals of 2 phases of the delay circuits is forcibly set to the specific potential, when the input signals of 2 phases of the delay circuits connected to the even stages in the ring form are at the same predetermined level. The process of forcibly setting one of the output signals to the specific potential at the time of the common-mode state is performed by each of the delay circuits at even stages and the delay circuits at odd stages. Therefore, even when the signals are common-mode at one of a high level and a low level, the differential ring oscillation unit is activated in a normal oscillation state.

According to the embodiments of the present disclosure, the detecting of the common-mode level state is performed by each of the delay circuits at even stages and the delay circuits at odd stages. Thus, even in any common-mode level, the differential ring oscillation unit is activated in the normal oscillation state. Therefore, according to the embodiments of the present disclosure, a deadlock state can be efficiently avoided.

DETAILED DESCRIPTION OF THE EMBODIMENTS

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Examples of a differential ring oscillation circuit, a device, and an oscillation control method according to an embodiment of the present disclosure will be described with reference to the drawings. The description will be made in the following order.

1. Exemplary Embodiment (FIGS. 1 to 4)
2. Modified example 1 of Activation Circuit (FIG. 5)
3. Modified example 2 of Activation Circuit (FIG. 6)
4. Modified example 3 of Activation Circuit (FIGS. 7 and 8)
5. Other Modified examples

[1. Embodiment]

Figure 1:
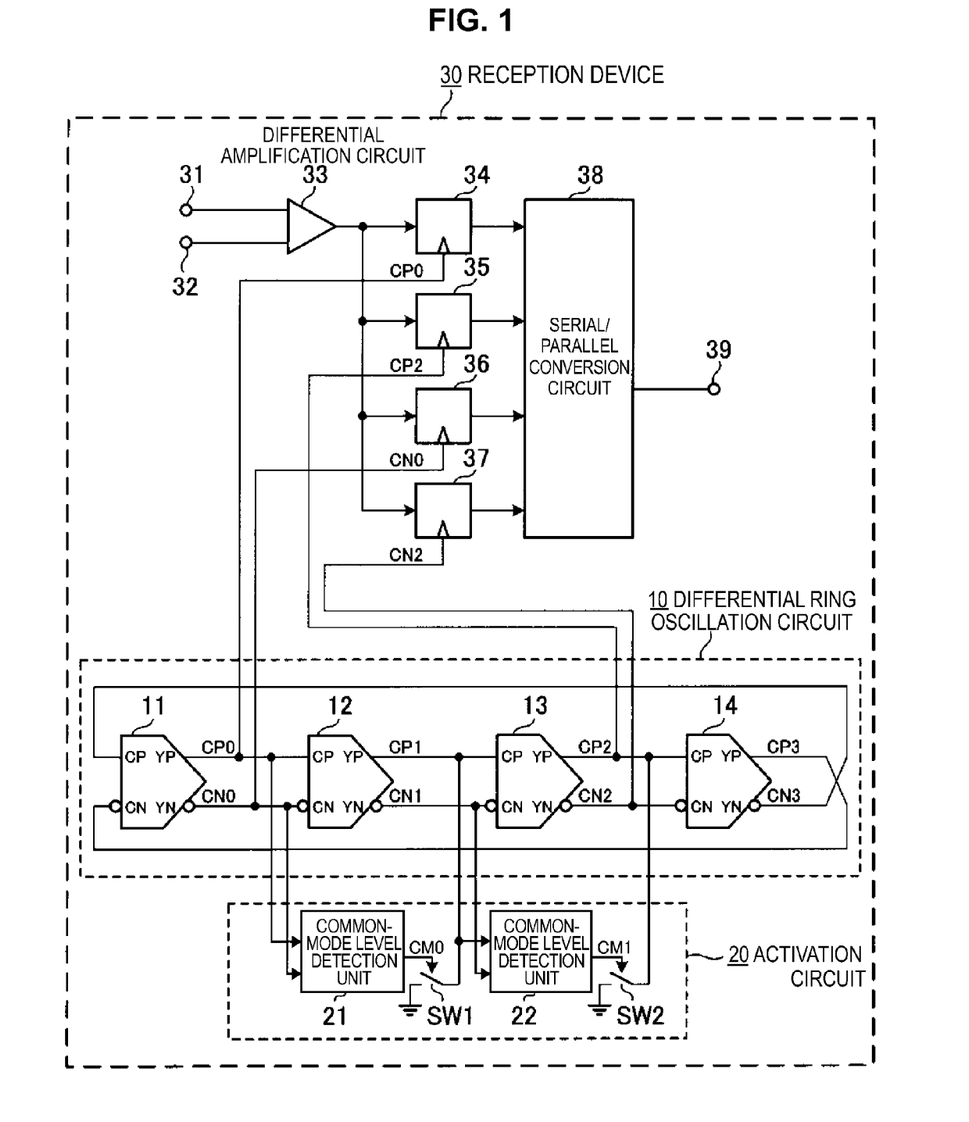
FIG. 1 is a circuit diagram illustrating an example of the configuration according to an embodiment of the present disclosure.

FIG. 1 is a diagram illustrating an example of the configuration of a device including a differential ring oscillation circuit 10 according to an embodiment of the present disclosure.

The differential ring oscillation circuit 10 is a circuit in which four delay circuits 11, 12, 13, and 14 are connected in a ring form so that an oscillation signal with a predetermined frequency can be obtained. The delay circuits 11 to 14 each delay and output signals 2 phases with mutually different levels. Here, the amounts of delay of the signals in the delay circuits 11 to 14 are set to be the same. The oscillation frequency of the differential ring oscillation circuit 10 is determined based on the amount of delay of each of the delay circuits 11 to 14 and the number of stages at which the delay circuits 11 to 14 are connected.

A case in which the delay circuits 11 to 14 each output the signals of 2 phases with mutually different levels is a case of a right operation state. When the oscillation circuit is not normal, the levels of the signals of 2 phases are the same in some cases.

Connection of the delay circuits 11 to 14 illustrated in FIG. 1 will be described.

A signal CP0 output from one output terminal YP of the delay circuit 11 is supplied to one input terminal CP of the delay circuit 12 at the subsequent stage. A signal CN0 output from the other output terminal YN of the delay circuit 11 is supplied to the other input terminal CN of the delay circuit 12 at the subsequent stage.

Then, a signal CP1 output from one output terminal YP of the delay circuit 12 is supplied to one input terminal CP of the delay circuit 13 at the subsequent stage. A signal CN1 output from the other output terminal YN of the delay circuit 12 is supplied to the other input terminal CN of the delay circuit 13 at the subsequent stage.

Then, a signal CP2 output from one output terminal YP of the delay circuit 13 is supplied to one input terminal CP of the delay circuit 14 at the subsequent stage. A signal CN2 output from the other output terminal YN of the delay circuit 13 is supplied to the other input terminal CN of the delay circuit 14 at the subsequent stage.

Then, a signal CP3 output from one output terminal YP of the delay circuit 14 at the final stage is supplied to the input terminal CN of the delay circuit 11 at the first stage. A signal CN3 output from the other output terminal YN of the delay circuit 14 is supplied to the input terminal CP of the delay circuit 11 at the first stage.

Thus, from the delay circuit 11 at the first stage to the delay circuit 14 at the fourth stage, the output signals CP0, CP1, and CP2 are supplied to the same-phase input terminals CP without change, and the output signals CN0, CN1, and CN2 are supplied to the common-mode input terminals CP without change. The signals CP3 and CN3 output from the two output terminals YP and YN of the delay circuit 14 at the final stage are supplied to the input terminals CP and CN of the delay circuit 11 at the first stage in an inverted state.

Thus, by connecting the delay circuits 11 to 14 at the four stages in this way, the delay circuits 11 to 14 output oscillation signals whose phases are each shifted by ⅛. That is, when the phase of the output signals CP0 and CN0 of the delay circuit 11 at the first stage is set to the reference phase, the output signals CP1 and CN1 of the delay circuit 12 at the second stage become signals in which a phase is shifted by ⅛ period. The output signals CP2 and CN2 of the delay circuit 13 at the third stage become signals in which a phase is shifted by ¼ period from the reference phase. The output signals CP3 and CN3 of the delay circuit 14 at the fourth stage become signals in which a phase is shifted by ⅜ period from the reference phase.

The oscillation signal with each phase in the differential ring oscillation circuit 10 is supplied to each circuit in an electronic device (apparatus). FIG. 1 illustrates an example in which the differential ring oscillation circuit is applied to a reception device 30 that receives a high-speed serial signal. The reception device includes a differential amplification circuit 33 that amplifies signals supplied from transmission lines to input terminals 31 to 32. The reception device further includes a plurality of flip-flops 34 to 37 that sample a serial signal output by the differential amplification circuit 33 at a multi-phase clock, and a serial/parallel conversion circuit 38 that parallel-converts the signal sampled by the flip-flops 34 to 37. The signal parallel-converted by the serial/parallel conversion circuit 38 can be obtained from the output terminal 39.

The differential ring oscillation circuit 10 supplies the plurality of flip-flops 34 to 37 with the output signals CP0 and CN0 of the delay circuit 11 at the first stage and the output signals CP2 and CN2 of the delay circuit 13 at the third stage. Thus, by supping the signals CP0 and CN0 and the signals CP2 and CN2 in this way, the plurality of flip-flops 34 to 37 are supplied with the oscillation signals whose phases are each shifted by ¼ period. The plurality of flip-flops 34 to 37 perform a reception process using the oscillation signals as a clock.

When a signal whose phase is shifted by ⅛ period or ⅜ period from the reference phase is necessary, the plurality of flip-flops 34 to 37 are supplied with the output signals CP1 and CN1 of the delay circuit 12 at the second stage or the output signals CP3 and CN3 of the delay circuit 14 at the fourth stage.

The differential ring oscillation circuit 10 illustrated in FIG. 1 includes an activation circuit 20. The activation circuit 20 activates the differential ring oscillation circuit 10. The activation circuit 20 illustrated in FIG. 1 includes a common-mode level detection unit 21 that is supplied with the two output signals CP0 and CN0 of the delay circuit 11 at the first stage, and a common-mode level detection unit 22 that is supplied with the two output signals CP1 and CN1 of the delay circuit 12 at the second stage. Each of the common-mode level detection units 21 and 22 detects whether the supplied two signals (CP0 and CN0 or CP1 and CN1) are at the same level. When it is detected that the signals supplied to the common-mode level detection units 21 and 22 have a predetermined level at the same phase, switches SW1 and SW2 are turned on by output signals CM0 and CM1 of the common-mode level detection units 21 and 22.

For example, the common-mode level detection unit 21 turns on the switch SW1 by the output signal CM1, when the supplied two signals CP0 and CN0 have the same specific level (a high level or a low level). Further, the common-mode level detection unit 22 turns on the switch SW2 by the output signal CM1 when the supplied two signals CP1 and CN1 have the same specific level (the high level or the low level).

The switch SW1 is a switch that connects one output signal CP1 of the delay circuit 12 at the second stage to a ground potential unit. Accordingly, when the switch SW1 is in the ON state, the output signal CP1 forcibly becomes a ground potential.

The switch SW2 is a switch that connects one output signal CP2 of the delay circuit 13 at the third stage to a ground potential unit. Accordingly, when the switch SW2 is in the ON state, the output signal CP2 forcibly becomes a ground potential.

Figure 2:
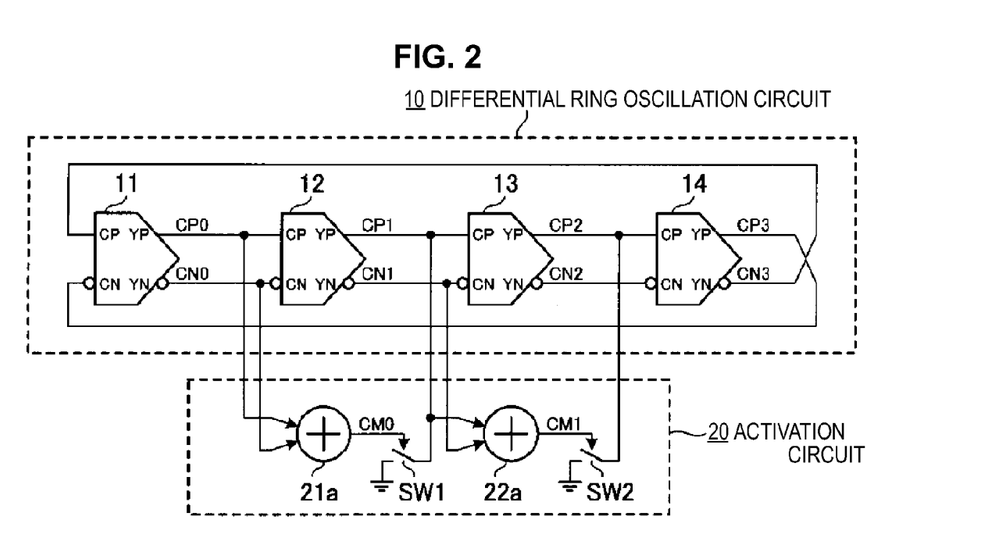
FIG. 2 is a circuit diagram illustrating an example in which an adder is used in a common-mode level detection unit in FIG. 1.

FIG. 2 is a diagram illustrating a specific example of the configuration of the common-mode level detection units 21 and 22 included in the activation circuit 20 illustrated in FIG. 1.

FIG. 2 illustrates an example in which adders 21a and 22a are used as the common-mode level detection units 21 and 22. That is, the adder 21a is supplied with the two output signals CP0 and CN0 of the delay circuit 11 at the first stage of the differential ring oscillation circuit 10. Further, the adder 22a is supplied with the two output signals CP1 and CN1 of the delay circuit 12 at the second stage.

When the supplied two signals CP0 and CN0 or CP1 and CN1 are both at a low level "L," the adder 21a or 22a outputs the low level "L." When one or both of the signals CP0 and CN0 or CP1 and CN1 are at a high level "H," the adder 21a or 22a outputs the high level "H."

When the signals with the low level "L" are supplied from the adders 21a and 22a, the switches SW1 and SW2 are turned on. When the signals with the high level "H" are supplied, the switches SW1 and SW2 are turned off.

FIGS. 3A to 3F and 4A to 4F are timing diagrams illustrating examples at the time of the activation of the differential ring oscillation circuit 10, when the adders 21a and 22a illustrated in FIG. 2 are used as the common-mode level detection units 21 and 22. FIGS. 3A to 3F and 4A to 4F illustrate examples in which the signal levels are inverted.

In the example of FIGS. 3A to 3F, at a given time T11, the two output signals CP0 and CN0 (FIG. 3A) of the delay circuit 11 in the first stage are both common-mode at the low level "L." In this state, the two output signals CP1 and CN1 (FIG. 3B) of the delay circuit 12 at the second stage become the high level "H." The two output signals CP2 and CN2 (FIG. 3C) of the delay circuit 13 at the third stage become the low level "L." The two output signals CP3 and CN3 (FIG. 3D) of the delay circuit 14 at the fourth stage become the high level "H."

Figure 3:
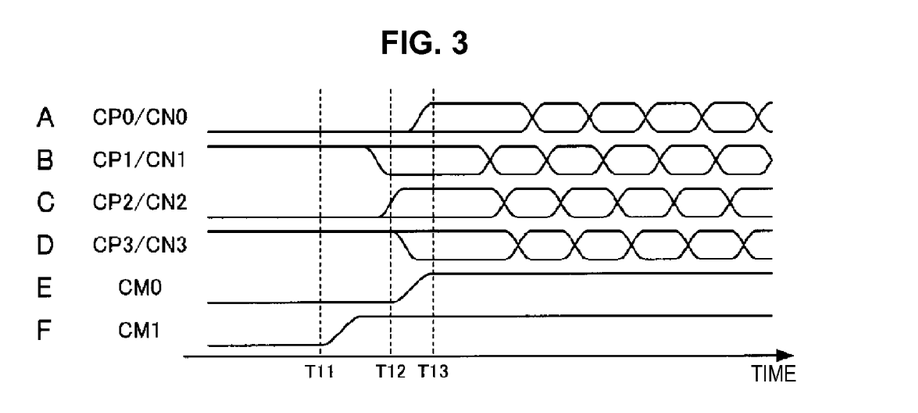
FIG. 3 includes timing diagrams A to F illustrating an example (first example) of an activation operation according to an embodiment of the present disclosure.

In the state of time T11, since the two signals are common-mode, the levels of the output signals of the delay circuits 11 to 14 in the differential ring oscillation circuit 10 do not change and the oscillation signals are not output.

Here, at time T11, since the signals CP0 and CN0 are both at the low level "L," the adder 21a in the activation circuit 20 outputs a low level "L" signal (FIG. 3E) and the switch SW1 is thus turned on. At time T11, since the signals CP1 and CN1 are both at the high level "H," the adder 22a in the activation circuit 20 is changed so as to output the high level "H" (FIG. 3F) and the switch SW2 is thus switched to the OFF state.

As illustrated in FIG. 3B, one output signal CP1 of the delay circuit 12 at the second stage is changed from the high level "H" to the low level "L" according to the state of the switches SW1 and SW2. Accordingly, at a time T12 sometime after time T11, the two signals CP1 and CN1 supplied from the delay circuit 12 at the second stage to the delay circuit 13 at the third stage change from common-mode level signals to differential signals.

Thus, when the differential signals are output, as illustrated in FIGS. 3C and 3D, the delay circuit 13 at the third stage and the delay circuit 14 at the fourth stage sequentially output differential signals. As illustrated in FIG. 3A, the delay circuit 11 at the first stage supplied with the output signals CP3 and CN3 of the delay circuit 14 at the fourth stage output differential signals.

As illustrated in FIG. 3E, at a time T13 at which the delay circuit 11 at the first stage outputs the differential signals, the output signal CM0 of the adder 21a is changed from the low level "L" to the high level "H" and the switch SW1 is thus switched to the OFF state.

By performing the activation process illustrated in FIGS. 3A to 3F, the delay circuits 11 to 14 at the respective stages delay the differential signals by only a given time and output the delayed differential signals, and thus the differential ring oscillation circuit 10 stably performs the oscillation operation.

FIGS. 4A to 4F illustrate common-mode level states in which the states of FIGS. 3A to 3F of the output signals of the delay circuits 11 to 14 at the respective stages are inverted.

Figure 4:
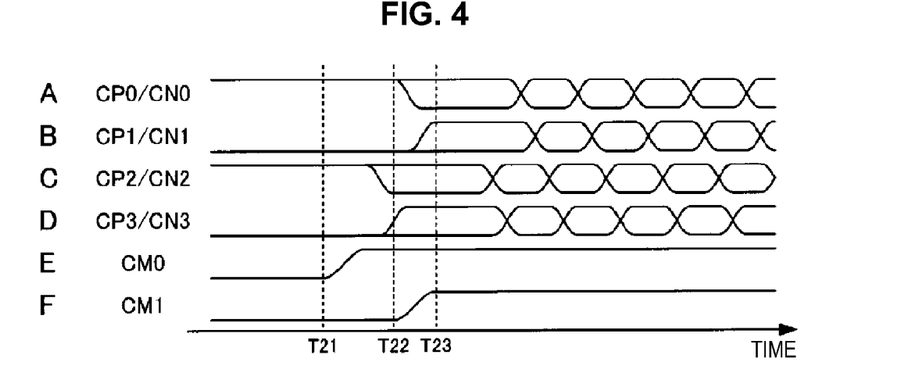
FIG. 4 includes timing diagrams A to F illustrating an example (second example) of an activation operation according to the embodiment of the present disclosure.

That is, at a given time T21, both of the two output signals CP0 and CN0 (FIG. 4A) of the delay circuit 11 at the first stage are common-mode at the high level "H." In this state, the two output signals CP1 and CN1 (FIG. 4B) of the delay circuit 12 at the second stage become the low level "L." The two output signals CP2 and CN2 (FIG. 4C) of the delay circuit 13 at the third stage become the high level "H." The two output signals CP3 and CN3 (FIG. 4D) of the delay circuit 14 at the fourth stage become the low level "L."

In the state of a time T21, since the two signals are at the common-mode level, the levels of the output signals of the delay circuits 11 to 14 in the differential ring oscillation circuit 10 are not changed and the oscillation signals are not output.

Here, at time T21, since the signals CP0 and CN0 are both at the high level "H," the adder 21a in the activation circuit 20 is changed so as to output a high level "H" signal (FIG. 4E) and the switch SW1 is thus switched to the OFF state. At time T21, since the signals CP1 and CN1 are both at the low level "L," the adder 22a in the activation circuit 20 outputs the low level "L" signal (FIG. 4F) and the switch SW2 thus remains in the ON state.

As illustrated in FIG. 4C, one output signal CP2 of the delay circuit 13 at the third stage is changed from the high level "H" to the low level "L" according to the state of the switches SW1 and SW2. Accordingly, at a time T22 sometime after time T21, the two signals CP2 and CN2 supplied from the delay circuit 13 at the third stage to the delay circuit 14 at the fourth stage are changed from the common-mode level signals to differential signals.

Thus, when the differential signals are output, as illustrated in FIG. 4D, the delay circuit 14 at the fourth stage outputs the differential signals. Further, when the differential signals are supplied, as illustrated in FIGS. 4A and 4B, the delay circuit 11 at the first stage and the delay circuit 12 at the second stage sequentially output the differential signals.

As illustrated in FIG. 4F, at a time T23 at which the delay circuit 12 at the second stage outputs the differential signals, the output signal CM0 of the adder 22a is changed from the low level "L" to the high level "H" and the switch SW2 is thus switched to the OFF state.

By performing the activation process illustrated in FIGS. 4A to 4F, the delay circuits 11 to 14 at the respective stages delay the differential signals by only a given time, and output the delayed differential signals, and thus the differential ring oscillation circuit 10 stably performs the oscillation operation.

Thus, in the differential ring oscillation circuit 10 according to the embodiment of the present disclosure, the activation circuit 20 can perform the activation in the stable oscillation state by performing the process of detecting that two output signals of the delay circuits at the respective stages are at the common-mode level and forcibly setting the output signals to the differential signals using the switches. In particular, the activation circuit 20 according to the embodiment of the present disclosure includes the common-mode level detection unit 21 that detects an output of the delay circuit 11 at an odd stage, and the common-mode level detection unit 22 that detects an output of the delay circuit 12 at an even stage. Thus, it is possible to obtain the advantage that countermeasures can be taken even when signals become the common-mode level at one phase. That is, when the differential ring oscillation circuit 10 is not in the oscillation state, the state illustrated in FIGS. 3A to 3F and the state in which each output signal is the inverse of the example of FIG. 3 are assumed. However, in either case, the activation circuit 20 can activate the differential ring oscillation circuit 10 in the stable oscillation state.

Therefore, in the differential ring oscillation circuit 10 according to the embodiment of the present disclosure, even when the outputs of the delay circuits 11 to 14 are temporarily in the common-mode level state, a deadlock state in which oscillation may not be performed can be efficiently avoided, and thus the oscillation state is maintained. Thus, for example, even when the oscillation state is disturbed due to disturbance noise of a power voltage by which the oscillation circuit is driven, the differential ring oscillation circuit 10 can continuously generate a clock stably.

2. Modified Example 1 of Activation Circuit

Next, Modified example 1 of the activation circuit 20 included in the differential ring oscillation circuit 10 according to the embodiment of the present disclosure will be described with reference to FIG. 5.

Figure 5:
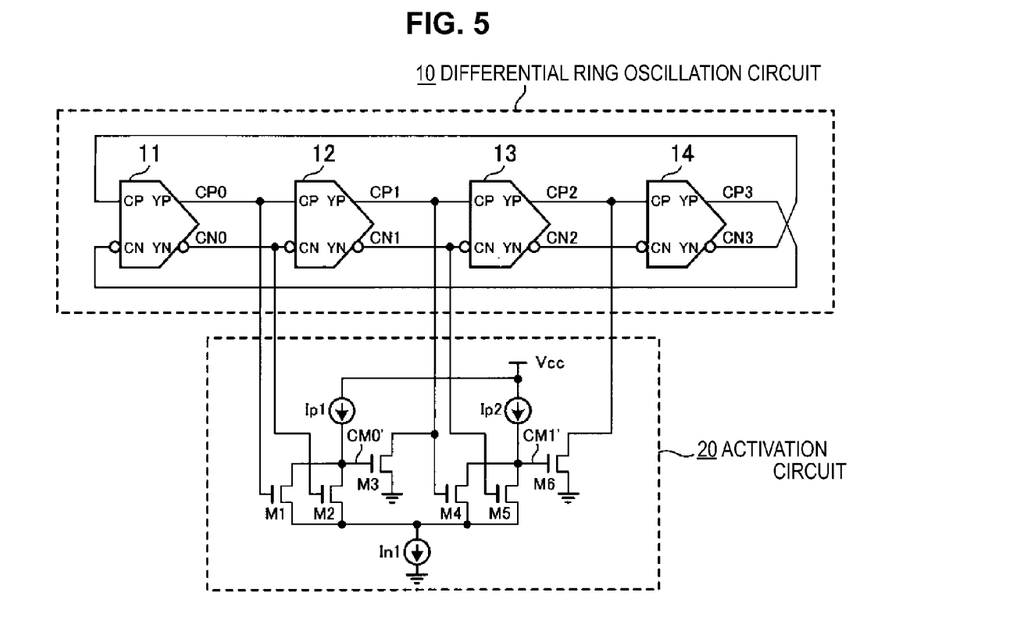
FIG. 5 is a circuit diagram illustrating the activation circuit according to a modified example (example 1)

In the activation circuit 20 illustrated in FIG. 5, the common-mode level detection units 21 and 22 and the switches SW1 and SW2 are configured as switching elements (transistors) and current sources.

When the circuit is described with reference to FIG. 5, two output signals CP0 and CN0 of the delay circuit 11 at the first stage of the differential ring oscillation circuit 10 are supplied to the gates of different transistors M1 and M2, respectively. A gap between the drain and the source of each of the transistors M1 and M2 are connected in parallel between a ground potential portion and a signal line from which a power voltage Vcc can be obtained. In this case, in the transistors M1 and M2, a current source Ip1 is connected to a side to which the power voltage Vcc is applied, and a current source In1 is connected to a ground potential side.

A connection point of the current source Ip1 and the transistors M1 and M2 is connected to the gate of a transistor M3. A gap between the drain and the source of the transistor M3 is connected between the ground potential portion and a signal line from which one output signal CP1 of the delay circuit 12 at the second stage can be obtained. The transistor M3 corresponds to the switch SW1 illustrated in FIG. 1.

Two output signals CP1 and CN1 of the delay circuit 12 at the second stage of the differential ring oscillation circuit 10 are supplied to the gates of different transistors M4 and M5, respectively. A gap between the drain and the source of each of the transistors M4 and M5 is connected in parallel between the ground potential portion and the signal line from which a power voltage Vcc can be obtained. In this case, in the transistors M4 and M5, a current source Ip2 is connected to a side to which the power voltage Vcc is applied, and the current source In1 is connected to the ground potential side.

A connection point of the current source Ip2 and the transistors M4 and M5 is connected to the gate of a transistor M6. A gap between the drain and the source of the transistor M6 is connected between the ground potential portion and a signal line from which one output signal CP2 of the delay circuit 13 at the third stage can be obtained. The transistor M6 corresponds to the switch SW2 illustrated in FIG. 1.

By setting the circuit illustrated in FIG. 5 as the activation circuit 20, the activation operation can be performed satisfactorily.

When an operation of the activation circuit 20 illustrated in FIG. 5 is described, for example, the output signals CP0, CN0, CP2, and CN2 of the delay circuits 11 and 13 at the odd stages are assumed to be all at the low level "L" immediately after the activation of the differential ring oscillation circuit 10. Further, the output signals CP1, CN1, CP3, and CN3 of the delay circuits 12 and 14 at the even stages are assumed to be all the high level "H" signals.

Here, on the assumption that Ip is a current value of the current sources Ip1 and Ip2, and In is a current value of the current source In1, the relation "current value Ip<<a current value In/2" is assumed to be satisfied. That is, a current value of ½ of the current value In is assumed to be sufficiently greater than the current value Ip. At this time, since the output signals CP0 and CN0 of the delay circuit 11 at the first stage are both at the low level "L," a signal CM0' obtained from the gate of the transistor M3 corresponding to the switch SW1 becomes the high level "H."

Further, since the output signals CP1 and CN1 of the delay circuit 12 at the second stage are both at the high level "H," a signal CM1' obtained from the gate of the transistor M6 corresponding to the switch SW2 becomes the low level "L."

Therefore, the transistor M3 is turned on and the transistor M6 is turned off. When the transistor M3 is turned on, the output signals CP1 and CN1 of the delay circuit 12 at the second stage are changed from the common-mode level signals to the differential signals. Thus, the differential signals are sequentially transmitted from the delay circuit 12 to the delay circuits 13 and 14 at the rear stages, and the differential signals are also transmitted to the delay circuit 11 at the first stage.

Here, when the output signals CP0 and CN0 of the delay circuit 11 at the first stage are changed to the differential signals, the signal CM0' obtained from the gate of the transistor M3 becomes the low level "L" and the transistor M3 is thus turned off. When the transistor M3 is turned off, the differential ring oscillation circuit 10 is stabilized in the oscillation state. When the differential ring oscillation circuit 10 is in the oscillation state, the transistors M3 and M6 corresponding to the switches SW1 and SW2 are both in the OFF state and have no influence on the oscillation operation.

When the levels of the output signals of the delay circuits 11 and 13 at the odd stages are the inverse of the levels of the output signals of the delay circuits 12 and 14 at the even stages, the transistor M6 corresponding to the switch SW2 is turned on, and thus the activation circuit 20 can likewise activate the differential ring oscillation circuit 10.

Accordingly, the activation circuit 20 using the transistors M1 to M6 and the like illustrated in FIG. 5 can reliably activate the differential ring oscillation circuit 10 from the state in which the output signals of the delay circuits 11 to 14 at the respective stages of the differential ring oscillation circuit 10 become the common-mode level.

3. Modified Example 2 of Activation Circuit

Figure 6:
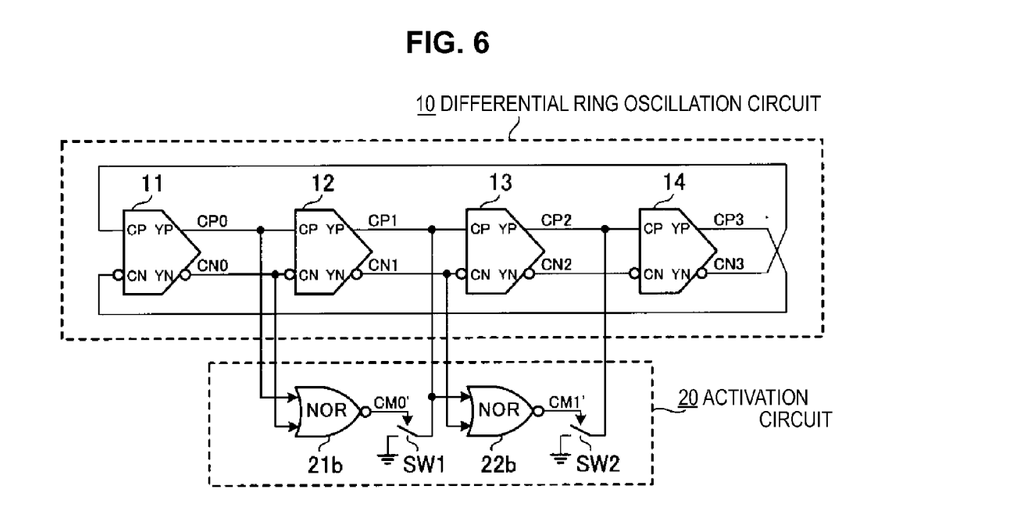
FIG. 6 is a circuit diagram illustrating the activation circuit according to a modified example (example 2)

Next, Modified example 2 of the activation circuit 20 included in the differential ring oscillation circuit 10 according to the embodiment of the present disclosure will be described with reference to FIG. 6. FIG. 6 is a diagram illustrating an example in which NOR gate circuits 21b and 22b are used as the common-mode level detection units 21 and 22 of the activation circuit 20.

That is, two output signals CP0 and CN0 of the delay circuit 11 at the first stage of the differential ring oscillation circuit 10 are supplied to the NOR gate circuit 21b. Further, two output signals CP1 and CN1 of the delay circuit 12 at the second stage are supplied to the NOR gate circuit 22b.

The NOR gate circuits 21b and 22b each output the high level "H" when the supplied two signals CP0 and CN0 and the supplied two signals CP1 and CN1 are both at the low level "L."

Then, the switch SW1 is controlled by a signal CM0' output by the NOR gate circuit 21b, and the switch SW2 is controlled by a signal CM1' output by the NOR gate circuit 22b. Specifically, each of the switches SW1 and SW2 is turned on when each of the NOR gate circuits 21b and 22b outputs the high level "H." Each of the switches SW1 and SW2 is turned off when each of the NOR gate circuits 21b and 22b outputs the low level "L."

When an operation of the activation circuit 20 illustrated in FIG. 6 is described, for example, the output signals CP0, CN0, CP2, and CN2 of the delay circuits 11 and 13 at the odd stages are assumed to be all at the low level "L" immediately after the activation of the differential ring oscillation circuit 10. Further, the output signals CP1, CN1, CP3, and CN3 of the delay circuits 12 and 14 at the even stages are assumed to be all at the high level "H."

At this time, since the output signals CP0 and CN0 of the delay circuit 11 at the first stage are both at the low level "L," a signal CM0' configured to control the switch SW1 becomes the high level "H."

Further, since the output signals CP1 and CN1 of the delay circuit 12 at the second stage are both at the high level "H," a signal CM1' configured to control the switch SW2 becomes the low level "L."

Therefore, the switch SW1 is turned on and the switch SW2 is turned off. When the switch SW1 is turned on, the output signals CP1 and CN1 of the delay circuit 12 at the second stage are changed from the common-mode level signals to the different signals. Thus, the differential signals are sequentially transmitted from the delay circuit 12 to the delay circuits 13 and 14 at the rear stages, and the differential signals are also transmitted to the delay circuit 11 at the first stage.

Here, when the output signals CP0 and CN0 of the delay circuit 11 at the first stage are changed to the differential signals, the switch SW1 is thus switched to the OFF state. When the switch SW1 is turned off, the differential ring oscillation circuit 10 is stabilized in the oscillation state. When the differential ring oscillation circuit 10 is in the oscillation state, the switches SW1 and SW2 are both in the OFF state and have no influence on the oscillation operation.

When the levels of the output signals of the delay circuits 11 and 13 at the odd stages are the inverse of the levels of the output signals of the delay circuits 12 and 14 at the even stages, the switch SW2 is turned on, and thus the activation circuit 20 can likewise activate the differential ring oscillation circuit 10.

Accordingly, the activation circuit 20 using the NOR gate circuits 21b and 22b illustrated in FIG. 6 can reliably activate the differential ring oscillation circuit 10 from the state in which the output signals of the delay circuits 11 to 14 at the respective stages of the differential ring oscillation circuit 10 become the common-mode level.

4. Modified Example 3 of Activation Circuit

Next, Modified example 3 of the activation circuit 20 included in the differential ring oscillation circuit 10 according to the embodiment of the present disclosure will be described with reference to FIGS. 7 and 8.

Figure 7:
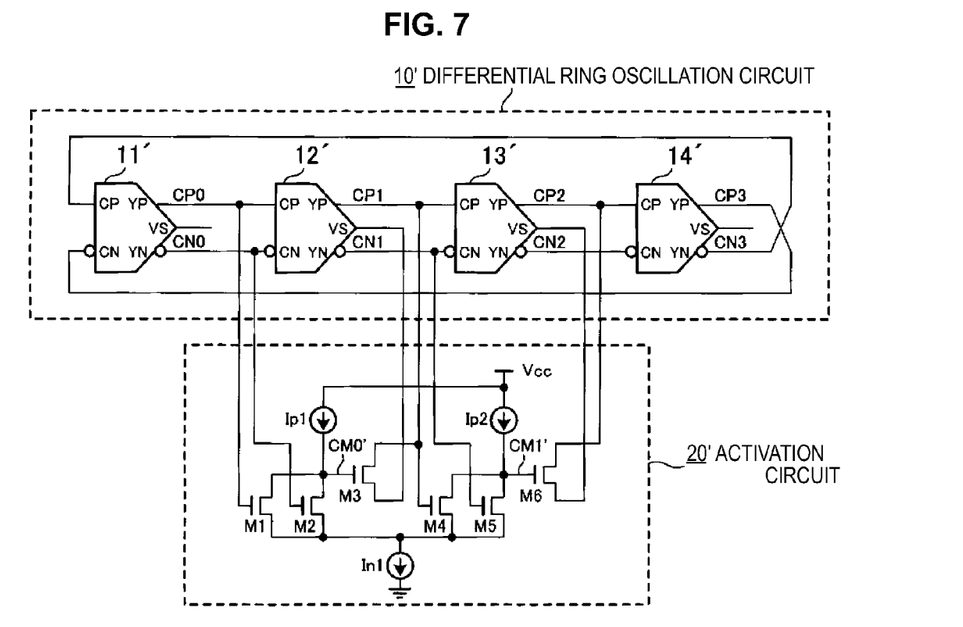
FIG. 7 is a circuit diagram illustrating the activation circuit according to a modified example (example 3)

In a differential ring oscillation circuit 10' illustrated in FIG. 7, each of delay circuits 11' to 14' is configured as a current mode logic including a current source and the low level "L" signal output by each of the delay circuits 11' to 14' is set to a specific potential higher than a ground potential.

Figure 8:
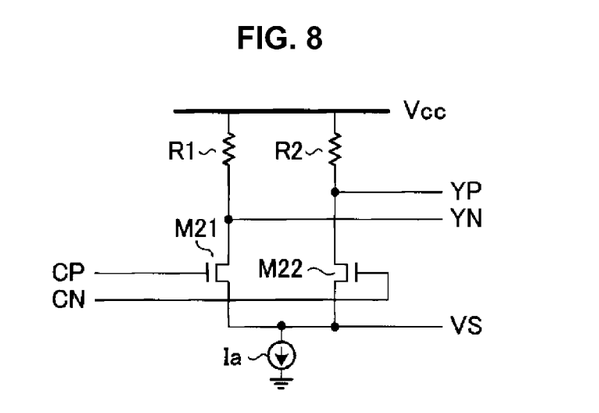
FIG. 8 is a circuit diagram illustrating an example of a delay circuit included in an oscillation circuit in the example of FIG. 7.

In this case, each of the delay circuits 11' to 14' illustrated in FIG. 7 is assumed to be, for example, a circuit illustrated in FIG. 8.

That is, as illustrated in FIG. 8, each of the delay circuits 11' to 14' includes transistors M21 and M22. Signals obtained from two input terminals CP and CN are separately supplied to the gates of the transistors M21 and M22.

Then, a signal line from which a power voltage Vcc is obtained is connected to a current source Ia via a resistor R1 and a gap between the drain and the source of the transistor M21. Further, the signal from which a power voltage Vcc is obtained is connected to a current source Ia via a resistor R2 and a gap between the drain and the source of the transistor M22.

A signal obtained from a connection point between the resistor R1 and the transistor M21 is supplied to an output terminal YP, and a signal obtained from a connection point between the resistor R2 and the transistor M22 is supplied to an output terminal YN.

A signal obtained from a connection point among the transistors M21 and M22 and the current source Ia is supplied to an output terminal VS.

Each of the delay circuits 11' to 14' configured as the circuit illustrated in FIG. 8 becomes a specific potential corresponding to a current value set in the current source Ia, when the signals obtained from the output terminals YP and YN are at the low level "L."

Referring back to the description of FIG. 7, an activation circuit 20' connected to the differential ring oscillation circuit 10' illustrated in FIG. 7 is a circuit to which the activation circuit 20 including the transistors M1 to M6 and the current sources Ip1, Ip2, and In1 illustrated in FIG. 5 is applied.

Here, in the case of the activation circuit 20 illustrated in FIG. 5, when the transistor M3 corresponding to the switch SW1 is in the ON state, the signal line from which the signal CP1 is obtained is configured to be connected to the ground potential portion. On the other hand, in the case of the activation circuit 20' illustrated in FIG. 7, when the transistor M3 corresponding to the switch SW1 is in the ON state, the signal line from which the signal CP1 is obtained is configured to be connected to the output terminal VS of the delay circuit 12'.

Likewise, when the transistor M6 corresponding to the switch SW2 is in the ON state, the signal line from which the signal CP2 is obtained is configured to be connected to the output terminal VS of the delay circuit 13'.

The remaining configuration of the activation circuit 20' is configured to be the same as that of the activation circuit 20 illustrated in FIG. 5.

In the case of the activation circuit 20' illustrated in FIG. 7, when the transistor M3 or M6 in the activation circuit 20' is turned on, the signal CP1 or CP2 becomes the same potential as the low level "L" of the signal output by each of the delay circuits 11' to 14'. Accordingly, when the activation circuit 20' performs the activation operation, the signal level is set appropriately. Thus, the same activation operation as that of the activation circuit 20 illustrated in FIG. 5 can be performed.

5. Other Modified Examples

The differential ring oscillation circuit 10 (or 10') illustrated in each drawing has been configured to include the delay circuits 11 to 14 (or 11' to 14') at four stages and extract the oscillation signals in which each phase is shifted by ⅛ period. On the other hand, a differential ring oscillation circuit in which delay circuits at even stages other than four stages are connected may include the activation circuit 20 (or 20') according to the embodiment of the present disclosure.

That is, the differential ring oscillation circuit including the delay circuits at the even stages detects that two signals output by one delay circuit at an odd stage are at the common-mode level, and detects that two signals output by one delay circuit at an even stage are at the common-mode level. It is detected that two signals output by one delay circuit at an even stage are at the common-mode level. Then, based on the detection of each common-mode level state, the activation is performed using differential signals by changing the level of one of the two signals output by one delay circuit.

By performing such an operation, the differential ring oscillation circuit including the delay circuits at various numbers of stages performs oscillation stably.

The differential ring oscillation circuit 10 illustrated in FIG. 1 has been configured as a clock generation circuit included in the device receiving a high-speed serial signal. On the other hand, the activation circuit 20 or 20' according to the embodiment of the present disclosure may be applied to an oscillation circuit included in a device that includes other various signal processing units.

Additionally, the present disclosure may also be configured as below.

(1)

A differential ring oscillation circuit including:
    a differential ring oscillation unit in which delay circuits, to which signals of 2 phases are input, and which delay and output the input signals of 2 phases, are connected at even stages in a ring form;
    a first common-mode level detection unit that detects that the input signals of 2 phases of one delay circuit at an even stage of the differential ring oscillation unit are at a same predetermined level;
    a first switch that sets, to a specific potential, one of the output signals of 2 phases of the delay circuit delaying the input signals of 2 phases, when the first common-mode level detection unit detects the same predetermined level;
    a second common-mode level detection unit that detects that the input signals of 2 phases of one delay circuit at an odd stage of the differential ring oscillation unit are at the same predetermined level; and
    a second switch that sets, to the specific potential, one of the output signals of 2 phases of the delay circuit delaying the input signals of 2 phases, when the second common-mode level detection unit detects the same predetermined level.

(2)

The differential ring oscillation circuit according to (1), wherein the specific potential set by the first and second switches is a ground potential.

(3)

The differential ring oscillation circuit according to (1) or (2), wherein the first and second common-mode level detection units are configured as adders that add the input signals of 2 phases.

(4)

The differential ring oscillation circuit according to (1) or (2),
    wherein the first and second common-mode level detection units include first and second transistors that are turned on or off according to levels of the input signals of respective phases, and
    wherein the first and second switches include a third transistor that is turned on when states of both of the first and second transistors are identical.

(5)

The differential ring oscillation circuit according to (1) or (2), wherein the first and second common-mode level detection units are configured as NOR gates.

(6)

The differential ring oscillation circuit according to any one of (1) to (5),
    wherein the delay circuits included in the differential ring oscillation units are configured as current mode logics including a current source, and
    wherein the specific potential set by the first and second switches is a potential of the current source.

(7)

A device including:
    a differential ring oscillation unit in which delay circuits, to which signals of 2 phases are input, and which delay and output the input signals of 2 phases, are connected at even stages in a ring form;

a first common-mode level detection unit that detects that the input signals of 2 phases of one delay circuit at an even stage of the differential ring oscillation unit are at a same predetermined level;

a first switch that sets, to a specific potential, one of the output signals of 2 phases of the delay circuit delaying the input signals of 2 phases, when the first common-mode level detection unit detects the same predetermined level;

a second common-mode level detection unit that detects that the input signals of 2 phases of one delay circuit at an odd stage of the differential ring oscillation unit are at the same predetermined level;

a second switch that sets, to the specific potential, one of the output signals of 2 phases of the delay circuit delaying the input signals of 2 phases, when the second common-mode level detection unit detects the same predetermined level; and a processing unit that is supplied with the signals extracted from the differential ring oscillation unit as a clock.

(8)

An oscillation control method including:

extracting input signals of 2 phases of one delay circuit at an even stage from a differential ring oscillation unit in which delay circuits delaying and outputting the signals of 2 phases are connected at even stages in a ring form, and setting one of the output signals of 2 phases of the delay circuit delaying the input signals of 2 phases to a specific potential, when it is detected that the input signals of 2 phases are at a same predetermined level; and extracting input signals of 2 phases of one delay circuit at an odd stage of the differential ring oscillation unit, and setting one of the output signals of 2 phases of the delay circuit delaying the input signals of 2 phases to the specific potential, when it is detected that the input signals of 2 phases are at the same predetermined level.

It should be understood by those skilled in the art that various modifications, combinations, sub-combinations and alterations may occur, depending on design requirements and other factors, insofar as they are within the scope of the appended claims or the equivalents thereof.

The present disclosure contains subject matter related to that disclosed in Japanese Priority Patent Application JP 2012-186725, filed in the Japan Patent Office on Aug. 27, 2012, the entire content of which is hereby incorporated by reference.

What is claimed is:

1. A differential ring oscillation circuit comprising:
a differential ring oscillation unit in which delay circuits, to which signals of 2 phases are input, and which delay and output the input signals of 2 phases, are connected at even stages in a ring form;
a first common-mode level detection unit that detects that the input signals of 2 phases of one delay circuit at an even stage of the differential ring oscillation unit are at a same predetermined level;
a first switch that sets, to a specific potential, one of the output signals of 2 phases of the delay circuit delaying the input signals of 2 phases, when the first common-mode level detection unit detects the same predetermined level;
a second common-mode level detection unit that detects that the input signals of 2 phases of one delay circuit at an odd stage of the differential ring oscillation unit are at the same predetermined level; and
a second switch that sets, to the specific potential, one of the output signals of 2 phases of the delay circuit delaying the input signals of 2 phases, when the second common-mode level detection unit detects the same predetermined level.

2. The differential ring oscillation circuit according to claim 1, wherein the specific potential set by the first and second switches is a ground potential.

3. The differential ring oscillation circuit according to claim 1, wherein the first and second common-mode level detection units are configured as adders that add the input signals of 2 phases.

4. The differential ring oscillation circuit according to claim 1,
wherein the first and second common-mode level detection units include first and second transistors that are turned on or off according to levels of the input signals of respective phases, and
wherein the first and second switches include a third transistor that is turned on when states of both of the first and second transistors are identical.

5. The differential ring oscillation circuit according to claim 1, wherein the first and second common-mode level detection units are configured as NOR gates.

6. The differential ring oscillation circuit according to claim 1,
wherein the delay circuits included in the differential ring oscillation units are configured as current mode logics including a current source, and
wherein the specific potential set by the first and second switches is a potential of the current source.

7. A device comprising:
a differential ring oscillation unit in which delay circuits, to which signals of 2 phases are input, and which delay and output the input signals of 2 phases, are connected at even stages in a ring form;
a first common-mode level detection unit that detects that the input signals of 2 phases of one delay circuit at an even stage of the differential ring oscillation unit are at a same predetermined level;
a first switch that sets, to a specific potential, one of the output signals of 2 phases of the delay circuit delaying the input signals of 2 phases, when the first common-mode level detection unit detects the same predetermined level;
a second common-mode level detection unit that detects that the input signals of 2 phases of one delay circuit at an odd stage of the differential ring oscillation unit are at the same predetermined level;
a second switch that sets, to the specific potential, one of the output signals of 2 phases of the delay circuit delaying the input signals of 2 phases, when the second common-mode level detection unit detects the same predetermined level; and
a processing unit that is supplied with the signals extracted from the differential ring oscillation unit as a clock.

8. An oscillation control method comprising:
extracting input signals of 2 phases of one delay circuit at an even stage from a differential ring oscillation unit in which delay circuits delaying and outputting the signals of 2 phases are connected at even stages in a ring form, and setting one of the output signals of 2 phases of the delay circuit delaying the input signals of 2 phases to a specific potential, when it is detected that the input signals of 2 phases are at a same predetermined level; and
extracting input signals of 2 phases of one delay circuit at an odd stage of the differential ring oscillation unit, and setting one of the output signals of 2 phases of the delay circuit delaying the input signals of 2 phases to the specific potential, when it is detected that the input signals of 2 phases are at the same predetermined level.

* * * * *